United States Patent [19]

Sermage et al.

[11] Patent Number: 4,779,280
[45] Date of Patent: Oct. 18, 1988

[54] SEMICONDUCTOR LASER EQUIPPED WITH MEANS FOR REINJECTING THE SPONTANEOUS EMISSION INTO THE ACTIVE LAYER

[76] Inventors: Bernard Sermage, 13 rue des Marouviers, 75016 Paris; Françoise Brillouet, 17, rue des Fontaines, 92 Levier, both of France

[21] Appl. No.: 867,933

[22] Filed: May 23, 1986

[51] Int. Cl.[4] .............................................. H01S 3/19
[52] U.S. Cl. ...................................... 372/45; 372/46; 372/48; 357/17
[58] Field of Search ................................... 372/44-46, 372/48; 357/17

[56] References Cited

U.S. PATENT DOCUMENTS 4,590,501 5/1986 Scholl ................................... 357/17

FOREIGN PATENT DOCUMENTS 8503809 8/1985 PCT Int'l Appl. ................... 357/17

Primary Examiner—William L. Sikes
Assistant Examiner—Georgia Y. Epps
Attorney, Agent, or Firm—Oblon, Fisher, Spivak, McClelland & Maier

[57] ABSTRACT

Double heterostructure semiconductor laser in which the contact layer is transparent to the spontaneous radiation emitted by the active layer. The upwardly directed light is then reflected by the metal layer and returned to the active layer.

5 Claims, 1 Drawing Sheet

SEMICONDUCTOR LASER EQUIPPED WITH MEANS FOR REINJECTING THE SPONTANEOUS EMISSION INTO THE ACTIVE LAYER

BACKGROUND OF THE INVENTION

The present invention relates to a semiconductor laser equipped with means for reinjecting the spontaneous emission into the active layer and which is used in optical telecommunications.

The technical field of the invention is that of so-called double heterostructure semiconductor lasers. Such a structure is constituted by a stack of semiconductor layers deposited by epitaxy on a monocrystalline substrate. Starting from the substrate, there is generally an optional buffer layer, a first confinement layer, an active layer responsible for the light emission, a second confinement layer, a contact layer and finally a metal layer. The double hterostructure character results from the fact that the active layer is surrounded by two layers having a different composition from that of the active layer.

In the case of lasers emitting between 0.8 and 0.9 $\mu$m, the confinement layers are of alloy $Ga_{1-x}Al_xAs$ and the active layer and substrate of GaAs. For lasers emitting between 1.3 and 1.65 $\mu$m, the confinement layers are of $Ga_{1-x}In_xAs_{1-y}P_y$ and the active layer and substrate are of InP.

Using such structures, the threshold current density is approximately 1 kA/cm$^2$. In order to reduce the actual threshold current, use is made of different methods making it possible to define an active ribbon or tape of limited width. The threshold current is then approximately 1 mA.

The object of the present invention is on the one hand to reduce the threshold current density for structures having large surfaces and on the other hand to reduce the threshold current for structures with a lateral limitation.

SUMMARY OF THE INVENTION

For this purpose, the invention makes use of optical instead of electrical means. It has been decided to act on the compositions of the layers presented in order to enable the spontaneous radiation emitted in pure loss by the active layer towards the top and bottom of the structure, to be returned to the active layer, where it can partly be reabsorbed. For this purpose and in the simplest variant, the second contact layer has a composition such that it is transparent to the wavelength of the radiation. The spontaneous radiation emitted by the active layer can consequently traverse said contact layer and can be reflected on the upper metal layer and is then returned to the active layer.

In a more elaborate variant, the same arrangement is used on the substrate side. For this purpose, it is on the one hand necessary to etch part of the substrate to bring the lower metal contact layer beneath the stack of layers which have undergone epitaxy and on the other hand to add a lower contact layer between the metal layer and the first confinement layer. Like the upper contact layer, said contact layer must have a composition such that it is transparent to the wavelength of the radiation of the active layer. The part of this radiation directed towards the bottom of the structure can then be reflected onto the metal layer and back into the active layer.

When the active layer is of GaAs, the contact layers are of $Ga_{1-x}Al_xAs$ with x close to 0.1, i.e. between 0.05 and 0.2.

The threshold current density resulting from the invention can be explained as follows. The threshold current density of a semiconductor laser is inversely proportional to the life of the carriers, which is given by the formula:

$$\frac{1}{\tau} = \frac{1}{\tau nr} + \frac{1}{\tau ra}$$

in which $\tau nr$ is the non-radiative life and $\tau ra$ the apparent radiative life.

The reabsorption of the spontaneous radiation in the active layer following reflection on the upper and lower metal layers leads to an increase in the apparent radiative life, which leads to an increase in $\tau$ causing a reduction in the threshold current density.

The measurements performed by the Applicants have revealed that with a GaAs/GaAlAs heterostructure, a reduction by a factor of 5 could be obtained on the threshold current density, which then drops to 200 A/cm$^2$.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 1:
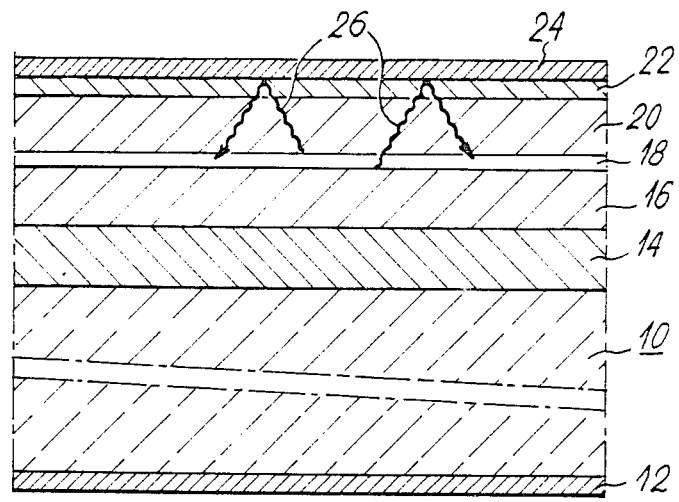
FIG. 1 A first variant in which the light emitted towards the top of the structure is reflected on the upper metal layer.

The laser shown in FIG. 1 comprises a substrate 10, whose lower part is covered by a first metal layer 12 and whose upper part is covered by a buffer layer 14, a first n-doped confinement layer 16, an undoped active layer 18, a second p-doped confinement layer 20, a p+ doped contact layer 22 and a metal layer 24. According to the invention, the composition of the contact layer 22 is such that it is transparent to the wavelength of the radiation emitted by the active layer.

In the case of a GaAs/GaAlAs heterostructure, the following compositions and thicknesses can be obtained, without the invention being limited thereto:

10: GaAs, thickness 100 $\mu$m,
14: n-doped GaAs ($10^{18}$cm$^{-3}$), thickness 1 $\mu$m,
16: n-doped $Ga_{0.7}Al_{0.3}As$ ($10^{18}$cm$^{-3}$), thickness 1 $\mu$m,
18: undoped GaAs, thickness 0.15 $\mu$m,
20: p-doped $Ga_{0.7}Al_{0.3}As$ ($10^{18}$cm$^{-3}$), thickness 1 $\mu$m,
22: p+-doped $Ga_{0.9}Al_{0.1}As$ ($5.10^{18}$cm$^{-3}$), thickness 0.2 $\mu$m.

The GaAlAs layers 20 and 22 are transparent to the spontaneous radiation emitted by the GaAs layer 18 and the part 26 of said radiation which is emitted upwards is reflected on the metal layer 24.

Figure 2:
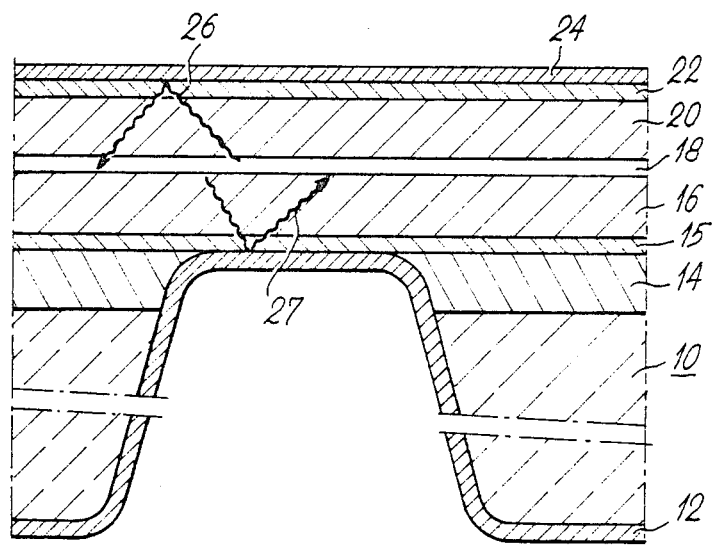
FIG. 2 A second variant in which, in addition to the aforementioned arrangement, the light emitted downwards is reflected onto a lower metal layer.

The variant of FIG. 2 again has the arrangement of FIG. 1, but another arrangement is added thereto. During the epitaxy of the layers on the substrate, a supplementary contact layer 15 is provided between layers 14 and 16. Substrate 10 is then etched over part of its length, as is the buffer layer 14. This etching reaches the supplementary layer 15. Metal layer 12 is then deposited on the lower part of the thus etched substrate, so that said layer comes into contact with layer 15. As for layer 22, the composition of layer 15 is such that it is transparent to the radiation emitted by the active layer. In the particular case referred to hereinbefore, layer 15 is of $Ga_{0.9}Al_{0.1}As$, and will be $n^+$-doped ($5.10^{18} cm^{-3}$), having a thickness of approximately 0.2 $\mu$m. Thus, not only is the upwardly directed radiation 26 returned into the active layer, but this also happens to the downwardly directed radiation 27.

What is claimed is:

1. A double heterostructure semiconductor laser with a reduced threshold current density, consecutively comprising:
    a substrate,
    a buffer layer,
    a first contact layer, part of the substrate and the buffer layer being etched down to the first contact layer,
    a first metal layer electrode located beneath the non-etched part of the substrate, on the etched part of said substrate and buffer layer and on said first contact layer,
    a confinement layer,
    an active layer emitting spontaneous and coherent radiations having a given wavelength,
    a second contact layer,
    a second metal layer electrode,
    said first and second contact layers being transparent to the wavelength of the spontaneous radiation emitted by the active layer, said spontaneous radiation being reflected by said first and second contact layers into said active layer where it is partly reabsorbed wherein the edges of said layers form a resonant cavity.

2. A laser according to claim 1, further comprising: on the buffer layer and beneath the first confinement layer, a second contact layer transparent to the wavelength of the radiation emitted by the active layer and wherein part of the substrate and the buffer layer are etched down to the second contact layer, with the first metal layer located beneath the substrate thus coming into contact with the second contact layer.

3. A laser according to claims 1 or 2, wherein the active layer is of GaAs and the first and second contact layers are of $Ga_{1-x}Al_xAs$, with high $p^+$ doping for the first and high $n^+$ doping for the second.

4. A laser according to claim 3, wherein x is to 0.1.

5. A laser according to claim 1, wherein the active layer is laterally confined.

* * * * *